(12) United States Patent
Kondo

(10) Patent No.: US 6,573,502 B2
(45) Date of Patent: Jun. 3, 2003

(54) COMBINED ELECTRON MICROSCOPE

(75) Inventor: Yukihito Kondo, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 10/095,305

(22) Filed: Mar. 11, 2002

(65) Prior Publication Data

US 2002/0166963 A1 Nov. 14, 2002

(30) Foreign Application Priority Data

Mar. 12, 2001 (JP) ........................................ 2001-068334

(51) Int. Cl.$^7$ ................................................ H01J 37/26
(52) U.S. Cl. ........................................ 250/311; 250/306
(58) Field of Search ................................ 250/306–307, 250/310–311, 252.1, 397

(56) References Cited

U.S. PATENT DOCUMENTS 4,206,349 A * 6/1980 Kamimura ................. 250/311
5,001,345 A * 3/1991 Suzuki ..................... 250/311

* cited by examiner

Primary Examiner—John R. Lee
Assistant Examiner—Christopher M. Kalivoda
(74) Attorney, Agent, or Firm—Webb Ziesenheim Logsdon Orkin & Hanson, P.C.

(57) ABSTRACT

A combined electron microscope capable of making SEM/STEM images and TEM image correspond to each other precisely. Angles of rotation of SEM/STEM images for matching TEM images to the angles of rotation of the SEM/STEM images, magnifications in TEM, and current values to be supplied into the imaging lenses are stored in a first memory. The magnifications of TEM images and angles of rotation for matching SEM/STEM images to the angles of rotation of TEM images are stored in the second memory. The image or images corrected by the computer are displayed on the display device.

6 Claims, 7 Drawing Sheets

Fig. 2

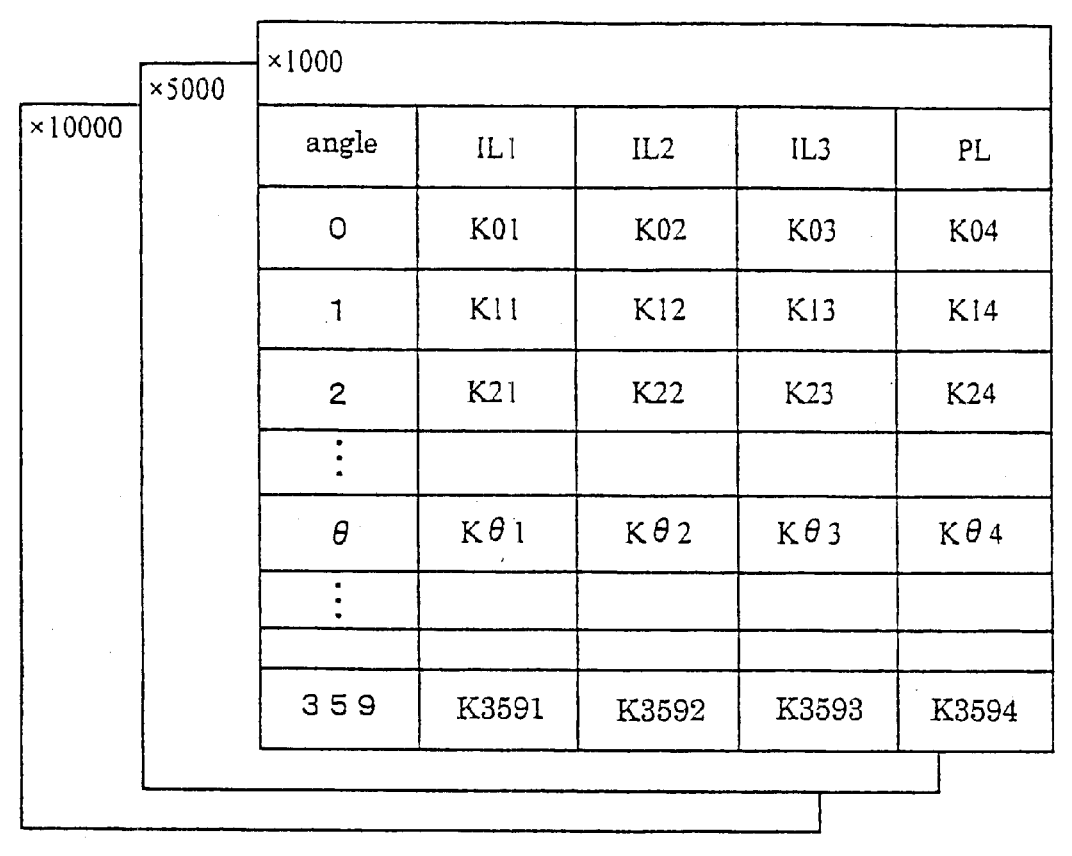

| | | | | |
|---|---|---|---|---|
| angle | IL1 | IL2 | IL3 | PL |
| 0 | K01 | K02 | K03 | K04 |
| 1 | K11 | K12 | K13 | K14 |
| 2 | K21 | K22 | K23 | K24 |
| ⋮ | | | | |
| θ | Kθ1 | Kθ2 | Kθ3 | Kθ4 |
| ⋮ | | | | |
| 359 | K3591 | K3592 | K3593 | K3594 |

×1000, ×5000, ×10000

| magnification | rotation |
|---|---|
| ×1000 | $\theta_1$ |
| ( | ( |
| ×1500000 | $\theta_n$ |

COMBINED ELECTRON MICROSCOPE

BACKGROUND OF THE INVENTION

1. Field of the Invention

The present invention relates to a combined electron microscope capable of displaying SEM/STEM images, and a TEM image and, more particularly, to an electron microscope permitting one to search for a field of view containing features of interest in a shorter time.

2. Description of the Related Art

Conventionally, combined TEM/STEM/SEM instruments have been developed as attachments to TEM instruments. In recent years, analytical functions offered by elemental analysis using X-ray spectroscopy or by electron energy loss spectroscopy have tended to be added in use. Point analysis, line analysis, or area analysis are performed on a specimen. That is, information is obtained from the specimen by local elemental analysis using the SEM/STEM mode.

FIG. 8 conceptually illustrates the configuration in the SEM/STEM mode. An electron beam focused by an electron lens L1 is deflected and scanned across a specimen 1 by a deflector 8. At this time, secondary electrons emanating from the surface of the specimen 1 are detected by a detector 2. For example, the detector 2 consists of a combination of a scintillator and a photomultiplier tube. When electrons strike the scintillator, light is emitted. The photomultiplier tube receives the emitted light and reconverts it into electrons, thus multiplying electrons.

A secondary electron signal obtained by the detector 2 is amplified by a following amplifier 3, and is sent as a brightness signal to a CRT 4. Thus, the brightness of the CRT 4 is varied according to the magnitude of the secondary electrons ejected by the specimen 1. That is, an SEM image is displayed on the viewing screen of the CRT 4. The mode of operation described thus far is referred to as the SEM mode or the SEM imaging mode.

Meanwhile, the electron beam passed through the specimen 1 is focused by an electron lens L2 and made to enter a detector 5, which in turn produces an electrical signal corresponding to the impinging, transmitted electron beam. For instance, this detector 5 can be a combination of a scintillator and a photomultiplier tube as mentioned previously. The output from this detector 5 is fed to a following amplifier 6, where the signal is amplified. The amplified transmission electron signal varies the brightness on another CRT 7 according to the magnitude of the electron beam transmitted through the specimen 1. As a result, an STEM image is displayed on the CRT 7. The mode of operation described thus far is referred to as the STEM mode or the STEM imaging mode. Note that a single CRT can be used as both CRTs 4 and 7.

A scintillator/photomultiplier combination is used for each of the SEM detector 2 and the STEM detector 5. However, the SEM detector 2 is provided with an electrode for pulling in electrons, unlike the STEM detector 5. A voltage of about +10 kV is applied to this electrode.

FIG. 9 conceptually illustrates the configuration in the TEM mode. The electron beam EB passed through an electron lens L3 is directed onto the specimen 1. At this time, the electron beam passed through the specimen 1 is enlarged and projected onto a fluorescent screen 10 by an electron lens L4. The operator can observe the image on the fluorescent screen.

The TEM image displayed on the fluorescent screen 10 is focused onto a TV camera 12 by an optical lens and/or optical fiber 11. The image is taken by the TV camera 12 and displayed on a CRT 13. The mode of operation described thus far is referred to as the TEM mode or the TEM imaging mode. In the case of a combined SEM/STEM/TEM instrument, the CRT 13 may be common with the CRT 4 or 7. The difference between SEM/STEM image(s) and the TEM image is as follows. In the SEM/STEM mode, a sharply focused electron beam is scanned across a specimen. In the TEM mode, a specimen is illuminated by a parallel beam of a large diameter.

Usually, the user searches for a field of view containing distinctive morphological features, such as crystal defects or crystal grain boundaries, by TEM and analyzes the field of view. Sometimes, the user may search for a field of view of interest (i.e., containing features) in the SEM/STEM mode and obtain a high-resolution image or electron diffraction pattern at that location in the TEM mode.

Where the combined instrument is used for the purpose described above, the correspondence between the TEM image and the SEM/STEM image(s) is very important. If their fields of view differ greatly, the user is prompted to search for a desired field of view in each mode of operation. To solve this problem, a memory for storing the values of electric current through the electron beam deflector is provided for each of the TEM mode and the SEM/STEM mode. In this way, the fields of view in the two modes are brought into coincidence.

However, the SEM/STEM images and the TEM image differ in nature. In particular, in an SEM image, areas where particles are present are brighter. In an STEM or TEM image, areas where particles are present are darker. In this manner, it is difficult to make their fields of view correspond to each other.

Furthermore, in the conventional electron microscope, a different detection method is used in each different mode of operation. In the TEM mode, the image rotates while imaging is being performed. Therefore, it has been difficult to ascertain the field of view in each mode. Furthermore, in the conventional microscope, a TEM image is displayed on the fluorescent screen in the image observation chamber, while SEM/STEM images are displayed on a CRT. This makes it difficult to compare the images created in the two different modes.

SUMMARY OF THE INVENTION

It is an object of the present invention to provide a combined electron microscope in which the SEM/STEM images and the TEM image can be made to precisely correspond to each other.

A first embodiment of the present invention for solving the foregoing problems is a combined electron microscope having an SEM/STEM mode and a TEM mode and capable of producing observable SEM/STEM images and TEM images. The microscope comprises a scanning device for the SEM/STEM mode, a storage memory in which magnifications of TEM images and angles of rotation of the images at those magnifications are stored, a computer control system for making corrections based on the data stored in the storage memory to match the SEM/STEM images in the SEM/STEM mode to the angles of rotation of the TEM images by controlling the scanning device, and a display device for displaying the images corrected by the computer control system.

Because of this structure, the angle of rotation (orientation) of the displayed SEM/STEM images can be matched to the displayed TEM image that rotates according to the magnification. Consequently, corresponding areas of the SEM/STEM images and TEM image can be displayed on the same display device at matched magnifications and at matched angles of rotation. Hence, the SEM/STEM images and TEM image can be made to correspond to each other precisely.

A second embodiment of the invention is a combined electron microscope having an SEM/STEM mode and a TEM mode and capable of producing observable SEM/STEM images and TEM images. The microscope comprises scanning means for the SEM/STEM mode, plural imaging lenses for the TEM mode, a first memory in which magnifications of the TEM images relative to angles of rotation of the SEM/STEM images and values of electrical current supplied to the imaging lenses for the TEM mode to match the angles of rotation of TEM images to the angles of rotation of SEM/STEM images are stored, a second memory in which angles of rotation of TEM images relative to the magnifications of the TEM images to match the angles of rotation of SEM/STEM images to the angles of rotation of the TEM images are stored, a computer for correcting angles of rotation based on data stored in the first or second memory and according to the used imaging mode, and a display device for displaying the image or images corrected by the computer control system.

In this structure, the orientation of a displayed TEM image can be aligned to SEM/STEM images that are rotated arbitrarily and displayed. Furthermore, the angle of rotation (orientation) of displayed SEM/STEM images can be aligned to a displayed TEM image rotating according to the magnification. In consequence, corresponding areas of the SEM/STEM and the TEM images can be displayed on the same display device at matched magnifications and at matched angles of rotation. Hence, the SEM/STEM and the TEM images can be made to correspond to each other precisely.

Other objects and features of the invention will appear in the course of the description thereof, which follows.

BRIEF DESCRIPTION OF THE DRAWINGS

FIG. 2 is a diagram illustrating the contents of data stored in memory 1 of the microscope shown in FIG. 1;

DESCRIPTION OF THE PREFERRED EMBODIMENTS

The preferred embodiments of the present invention are hereinafter described in detail with reference to the accompanying drawings.

Figure 1:
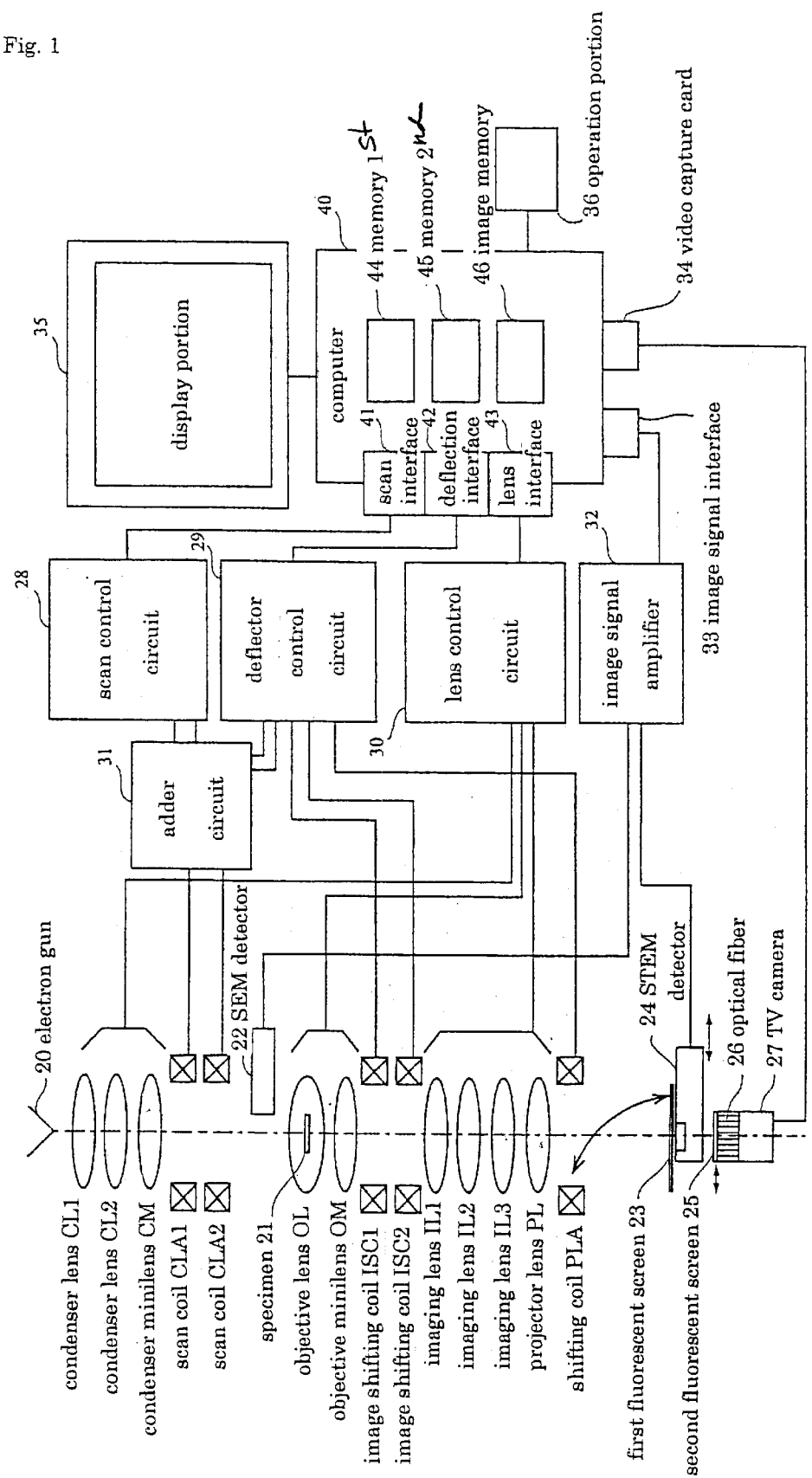
FIG. 1 is a block diagram of a combined electron microscope in accordance with one embodiment of the present invention.

FIG. 1 is a block diagram illustrating one mode for carrying out the invention. In the present invention, fields of view can be matched to each other. In addition, the magnifications of the fields of view or the angles of rotations can be matched to each other simultaneously. Otherwise, the magnification and angle of rotation of one field of view can be matched to those of the other field of view. The invention is applied to a microscope equipped with a TV system to permit one to observe TEM images on a CRT.

In FIG. 1, an electron gun 20 emits an electron beam that is focused by condenser lenses CL1, CL2, and a condenser minilens CM. Scan coils CLA1 and CLA2 scan or deflect the electron beam in the X- and Y-directions, respectively. The beam is directed at a specimen 21. As a result, secondary electrons are produced from the surface of the specimen 21. The produced secondary electrons are detected by an SEM detector 22. For example, a combination of a scintillator and a photomultiplier tube is used as the SEM detector 22. The scintillator emits light when electrons hit it. The photomultiplier tube receives the emitted light and reconverts it into electrons, thus multiplying electrons.

The electron gun 20, condenser lenses CL1, CL2, CM, scan coils CLA1, CLA2, and SEM detector 22 described thus far constitute the detection system of a scanning electron microscope (SEM).

An objective lens OL and an objective minilens OM magnify the electron beam transmitted through the specimen 21. The objective lens OL is used where the magnification factor of the image is large, while the objective minilens OM is employed where the magnification factor of the image is small. The lenses OL and OM are used simultaneously at a medium magnification range. Image shifting coils ISC1 and ISC2 are placed along the X- and Y-directions, respectively, to align the axes of the imaging lenses.

Imaging lenses IL1, IL2, IL3, and PL are imaging lenses for focusing the transmitted electron beam. The imaging lens PL is referred to as a projector lens and has a higher magnification than the other imaging lenses IL1, IL2, and IL3. Since lenses used in a TEM generally are of the electromagnetic type, the image is rotated according to the magnification of the lenses. However, if plural lenses, such as IL1, IL2, IL3, and PL, are used, and if their magnifications are combined properly, rotation of the image can be prevented or any desired rotation can be imparted to the image while maintaining constant the total magnification of the combination of the lenses. A projection image shifting coil PLA prevents the center of the magnified image from deviating from the center position.

A first fluorescent screen 23 receives transmitted electrons. An STEM detector 24 detects the image focused onto the fluorescent screen 23. The first fluorescent screen 23 is made of a fluorescent substance that emits light when transmitted electrons strike the substance. The STEM detector 24 consists, for example, of a photomultiplier tube that converts an optical signal into an electrical signal. A second fluorescent screen 25 also receives the transmitted electrons. The second fluorescent screen 25 has a fluorescent face that is excited into fluorescence by the incident electron beam. The first fluorescent screen 23 and the second fluorescent screen 25 are so designed as to be movable in the shown directions. For instance, where TEM imaging is carried out, the first fluorescent screen 23 is moved to permit the electron beam to directly hit the second fluorescent screen 25.

An optical fiber 26 optically guides the TEM image that has been converted into an optical image by the second fluorescent screen 25. A TV camera 27 acquires the TEM image transmitted via the optical fiber 26. A third fluorescent screen (not shown) has a fluorescent face on which the TEM image may impinge. This enables the user to observe the TEM image with the naked eye. At this time, the first fluorescent screen 23 and the second fluorescent screen 25 are moved sideways, and the TEM image is visualized on the third fluorescent screen.

The condenser lenses CL1, CL2, CM, scan coils CLA1, CLA2, objective lens OL or objective minilens OM, image shifting coils ISC1, ISC2, imaging lenses IL1, IL2, IL3, PL, projection image shifting coil PLA, fluorescent screen 23, and STEM detector 24 constitute the detection system of the STEM. The condenser lenses CL1, CL2, CM, objective lens OL or objective minilens OM, image shifting coils ISC1, ISC2, imaging lenses IL1, IL2, IL3, PL, projection image shifting coil PLA, fluorescent screen 25, optical fiber 26, and TV camera 27 constitute the detection system of the TEM.

A scan control circuit 28 controls the scanning system. A deflector control circuit 29 controls the deflection system. A lens control circuit 30 controls the lens system. The scan control circuit 28 can arbitrarily rotate the SEM/STEM images by adjusting the X- and Y-direction components of the electrical currents supplied to the scan coils CLA1 and CLA2. At this time, the direction of a certain reference scan is defined to be an angle of rotation of 0°. Similarly, the lens control circuit 30 can arbitrarily rotate the TEM image while maintaining its magnification constant by varying the combination of the electrical currents supplied to the imaging lenses IL1, IL2, IL3, and PL. Also, in this case, the direction coincident with the angle of rotation of 0° of the SEM/STEM images is defined to be an angle of rotation of 0°.

An adder circuit 31 receives output signals from the scan control circuit 28 and deflector control circuit 29 and supplies the sum of these signals to the scan coils CLA1 and CLA2. Furthermore, the adder circuit 31 receives a scan signal from the scan control circuit 28 and a signal used for adjustment of the optical axis, the latter signal being supplied from the deflector control circuit 29. The adder circuit 31 supplies the sum of the scan signal and the optical axis-adjusting signal to the scan coils CLA1 and CLA2.

The output from the deflector control circuit 29 is also fed to the image shifting coils ISC1, ISC2 and to the projection image shifting coil PLA controlling the deflection of the electron beam. The lens control circuit 30 supplies control signals to the condenser lenses CL1, CL2, CM, the objective lens OL or OM, and the imaging lenses IL1, IL2, IL3, and PL.

An image signal amplifier 32 receives the outputs from the SEM detector 22 and from the STEM detector 24 and amplifies them. A computer 40 controls the whole instrument. An image signal interface (ITF) 33 is connected between the image signal amplifier 32 and the computer 40 and converts the analog output signal from the image signal amplifier 32 into a digital image signal. A video capture card 34 is connected between the TV camera 27 and the computer 40 and converts the output signal from the TV camera 27 into a digital image signal. A display portion 35 is a display means connected with the computer 40 and acts to display the image information in each of the modes, i.e., the SEM/STEM mode and the TEM mode. For example, a CRT is used as the display portion 35. An operation portion 36 permits the user to specify a desired imaging mode through the computer 40. The user can enter various commands through this operation portion 36. A keyboard can be used, for example, as this operation portion 36.

A scan interface (ITF) 41 is connected between the scan control circuit 28 and the computer 40. A deflection interface (ITF) 42 is interfaced between the deflector control circuit 29 and the computer 40. A lens interface (ITF) 43 is connected between the lens control circuit 30 and the computer 40.

A memory (hereinafter abbreviated as the first memory) 44 acts as a first storage means in which the magnifications of SEM/STEM images and their angles of rotation are stored, as well as the values of electrical currents supplied into the imaging lenses IL1, IL2, IL3, and PL in TEM. These values are used when a TEM image is matched to the angle of rotation of the SEM/STEM images. Another memory (hereinafter abbreviated as the second memory) 45 serves as a second storage means in which the magnifications of the TEM images and their angles of rotation are stored, as well as the values of the electrical currents supplied into the scan coils CLA1, CLA2 in the SEM/STEM. These values are used when the SEM/STEM images are matched to the angle of rotation of a TEM image. An image memory 46 stores image signals in plural imaging modes, i.e., the SEM/STEM mode and the TEM mode. The operation of the instrument constructed in this way is described below.

(1) SEM/STEM Imaging Mode

When the user establishes the SEM/STEM imaging mode through the operation portion 36, the computer 40 carries out SEM/STEM imaging. In particular, as the electron beam hits the specimen 21, secondary electrons are produced and detected by the SEM detector 22, which in turn converts the secondary electrons into an electrical signal. The output signal from the SEM detector 22 is amplified by the image signal amplifier 32, which in turn supplies a secondary electron signal to the image signal interface 33. This interface 33 converts the secondary electron signal into a digital image signal that is stored in the image memory 46. The image signal held in the memory 46 is read out by the computer 40 and displayed on the display portion 35.

Meanwhile, the electron beam transmitted through the specimen 21 is passed through the imaging lenses IL1, IL2, IL3, and PL, focused by the objective lens OL or OM, and then directed at the fluorescent screen 23 made of a fluorescent material. This screen emits light according to the intensity of the incident electron beam. The emitted light is converted into an electrical signal by the STEM detector (photomultiplier tube) 24. This electrical signal is amplified by the following image signal amplifier 32. The output from the digital signal amplifier 32 is fed to the image signal interface 33 and converted into a digital image signal, which is stored in the image memory 46. The image signal held in the image memory 46 is read out by the computer 40 and displayed on the display portion 35. In this way, an SEM image and an STEM image are displayed simultaneously or separately on the display portion 35.

(2) TEM Imaging Mode

When the operator sets the mode of operation of the instrument to the TEM imaging mode through the operation portion 36, the computer 40 performs TEM imaging. Note that for the convenience of explanation, attention is given to only the magnification of the image during the operation and rotation of the image is neglected. Therefore, once the magnification of the image is determined, the imaging lenses IL1–IL3 and PL are controlled under conditions adapted for achievement of the magnification. Concomitantly, the image is rotated. Accordingly, the amounts of rotation relative to magnifications of images are previously determined, for example, by experiments.

In the TEM imaging mode, a parallel electron beam of a large diameter strikes the specimen 21. In this case, scan signals are not supplied to the scan coils CLA1 and CLA2.

The electron beam transmitted through the specimen 21 is rotated whenever the beam passes through each of the imaging lenses IL1–IL3 and PL. The beam passed through the imaging lens PL is projected onto the fluorescent screen 25, whereby the specimen is imaged onto the fluorescent screen. The image converted into light is guided to the TV camera 27 by the optical fiber 26. The TV camera 27 acquires the TEM image. The TEM image signal from the TV camera 27 is amplified by the image signal amplifier 32 and then converted into a digital image signal by the image signal interface 33. The digital image signal is stored in the image memory 46.

(3) Switching from SEM/STEM Imaging Mode to TEM Imaging Mode

It is assumed that the user has switched the mode of operation from the SEM/STEM imaging mode described under the heading "(1) SEM/STEM imaging mode" to the TEM imaging mode through the operation portion 36. When reading a switching instruction, the computer 40 adjusts the values of the electrical currents flowing through the imaging lenses IL1, IL2, IL3, and PL such that a TEM image is displayed at the same magnification and same angle of rotation as the SEM/STEM images.

For this purpose, the computer 40 reads out the data stored in the first memory 44. FIG. 2 illustrates the contents of the data stored in the first memory 44. In this figure, "×1000" indicates the magnification of the SEM/STEM image. In the SEM/STEM mode, the image does not rotate if the magnification is varied. Accordingly, it should be referred to as the magnification of the TEM image. This method is based on the assumption that the magnification of the SEM/STEM images and the magnification of a TEM image are brought into coincidence. Therefore, it is referred to as the magnification of the SEM/STEM images. "Angle" (see FIG. 2) indicates the angle of rotation of the SEM/STEM images. IL1, IL2, IL3, and PL indicate the various lenses of the imaging system. The value of the electrical current K$\theta$i (where $\theta$ is the angle of rotation and i indicates a number given to each lens) flowing through each lens of the imaging system is stored in the memory. The current value is necessary to obtain a TEM image at the same magnification and the same angle of rotation as the SEM/TEM images displayed at the specified magnification and specified angle of rotation. The angle is set from 0° to 359° in increments of 1°. The invention is not limited to this scheme. Such a table is prepared for each value of magnification. For example, the current values in these data tables can be previously found empirically.

In the TEM imaging mode, a parallel electron beam of a large diameter is directed at the specimen 21. In this mode, no scan signal is supplied to the scan coils CLA1 and CLA2. The electron beam transmitted through the specimen 21 is rotated whenever it passes through each of the imaging lenses IL1–IL3 and PL. The beam passed through the imaging lens PL is projected onto the fluorescent screen 25, thus forming an image on the screen. The image converted into light is guided to the TV camera 27 via the optical fiber 26. The TV camera 27 captures the TEM image. The TEM image signal from the TV camera 27 is amplified by the image signal amplifier 32 and then converted into a digital image signal by the image signal interface 33. Then, the signal is stored in the image memory 46.

Where the SEM/STEM image is scanned at an angle of rotation of 0°, for example, the SEM/STEM images displayed on the display portion 35 are rotation-free images. If the value of the current through each of the imaging lenses in the TEM is set to an arbitrary value, the electron beam is rotated whenever it passes through each imaging lens. Therefore, the TEM image displayed on the display portion 35 differs from the SEM/STEM images in magnification and angle of rotation. This makes it difficult to observe comparison of these images.

Where the magnification of the SEM/STEM image is ×1000 and the angle of rotation is 0°, the computer 40 reads current values K01, K02, K03, and K04 to be passed through the imaging lenses from the first memory 44 and operates the lens control circuit 30 via the lens interface 43 such that the current values described above flow into the imaging lenses. As a result, the TEM image displayed on the display portion 35 has the same magnification and same angle of rotation (0° in this example) as the SEM/STEM images. This permits an observational comparison with the SEM/STEM images.

Figure 3:
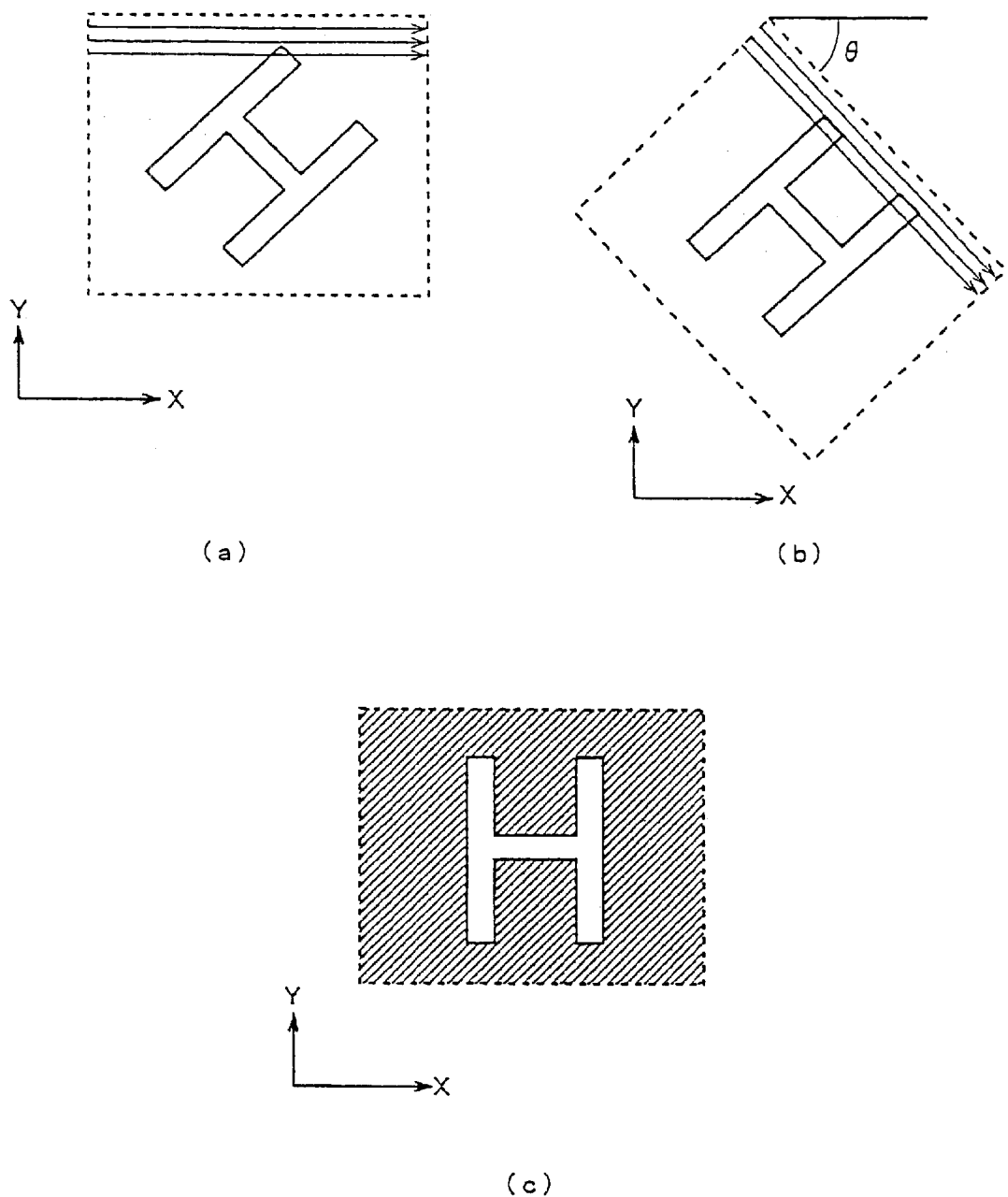
FIGS. 3(a)–3(c) are diagrams illustrating directions in which a specimen is scanned.

An adjustment method used when the SEM/STEM images are rotated is next described. FIG. 3(a) shows a specimen where the angle of rotation is 0°. The horizontal axis is the X-axis. The vertical axis is the Y-axis. When the specimen is scanned at an angle of rotation of 0°, an SEM image as shown in FIG. 3(a) is displayed on the display portion 35. If the direction in which the specimen is scanned is rotated through $\theta$ from the X-axis (horizontal direction) as shown in FIG. 3(b), the SEM image displayed on the display portion 35 assumes a form as shown in FIG. 3(c).

If the user gives an instruction through the operation portion 36 to switch the displayed image from SEM/STEM images to a TEM image, the computer 40 adjusts the values of electrical currents flowing through the imaging lenses such that the displayed TEM image is identical in magnification and angle with the SEM/STEM images shown in FIG. 3(c). Referring to the tables shown in FIG. 2, where scans are made at an angle of rotation of $\theta$, the values of electrical currents flowing through the imaging lenses are K$\theta$1, K$\theta$2, K$\theta$3, and K$\theta$4, respectively. The computer 40 controls the lens control circuit 30 so that these currents flow through the imaging lenses.

Figures 4, 5:
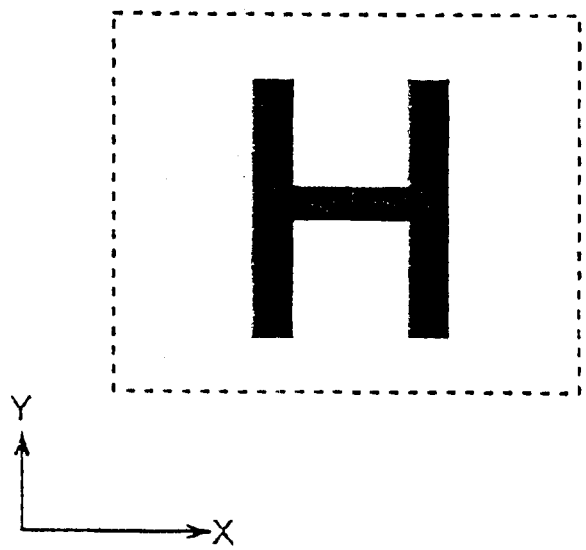
FIG. 4 is a diagram illustrating one example of a display of a TEM image.
FIG. 5 is a table illustrating the contents of data stored in memory 2 of the microscope shown in FIG. 1.

The resulting TEM image is shown in FIG. 4. The dark and bright portions of the pattern "H" are inverted with respect to the pattern of FIG. 3(c), because the elements, or the dark portions, of the pattern do not transmit the electron beam in the case of a transmission image.

(4) Switching from TEM Image to SEM/STEM Images

It is assumed that the mode of operation is first set to the TEM mode in which rotation of the image is neglected as already described under the heading "(2) TEM imaging mode" and that a TEM image is currently displayed on the display portion 35. If the user gives an instruction through the operation portion 36 to switch the image to SEM/STEM images, the computer 40 recognizes the switching instruction and adjusts the values of the electrical currents supplied into the scan coils CLA1 and CLA2 such that the magnification and angle of rotation of the SEM/STEM images will be the same as those of the TEM image when the switch is made. For this purpose, the computer 40 references the second memory 45.

FIG. 5 is a table illustrating the contents of data stored in the second memory 45. This table is made up of the magnifications of TEM images and angles of rotation at these magnifications.

Where a TEM image is displayed at an angle of rotation $\theta$ ($\theta=\theta1$ where the magnification is ×1000), for example, the computer 40 references the table in the second memory 45, and calculates the values of electrical currents Ix and Iy to be supplied into the scan coils CLA1 and CLA2 from $Ix_0$, $Iy_0$ and $\theta$, the currents Ix and Iy being necessary to display the SEM/STEM images at the same magnification and angle of rotation. The $Ix_0$ and $Iy_0$ are the values of electrical currents flowing through the coils when no rotation corrections are made, and depend on the magnification of the SEM/STEM images. The Ix and Iy are given by $$Ix = Ix_0 \cdot \cos\theta + Iy_0 \cdot \sin\theta$$

$$Iy = Iy_0 \cdot \cos\theta - Ix_0 \cdot \sin\theta$$

The computer 40 controls the scan control circuit 28 via the scan interface 41 to superimpose the current values Ix and Iy on the currents flowing through the scan coils CLA1 and CLA2, respectively. As a result, the SEM/STEM images are displayed as the same magnification and the angle of rotation as the TEM image. This facilitates making good comparisons in observation. A table may be created from the computed current values $Ix_0$, $Iy_0$, and angle of rotation θ, together with the current values Ix and Iy, which are stored in the second memory 45.

Figure 6:
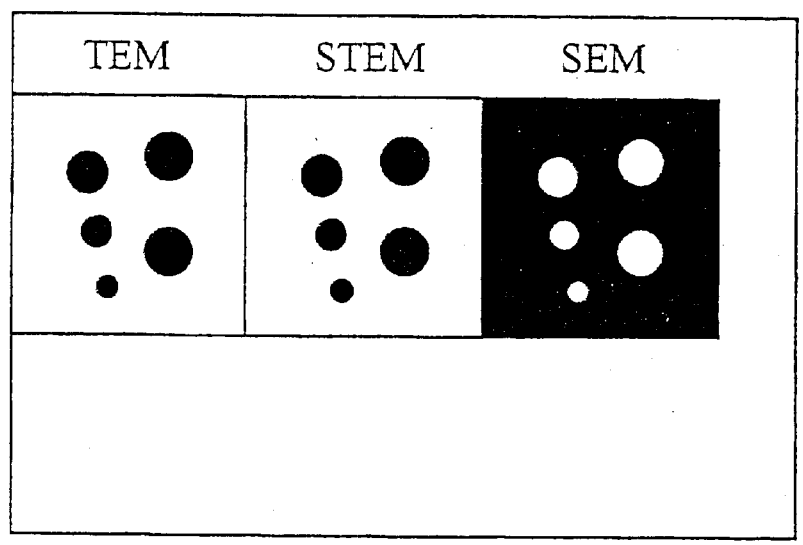
FIG. 6 is a diagram illustrating an example of a display provided on the display portion of the microscope shown in FIG. 1.

FIG. 6 is a diagram showing an example of a display provided on the display portion 35. A TEM image, an STEM image, and an SEM image are displayed. According to the present invention, image signals for SEM/STEM and an image signal for TEM can be stored in the image memory 46. Therefore, these SEM/STEM images and TEM image can be displayed on the display portion 35 simultaneously or separately. The TEM/STEM images and SEM image are inverted with respect to each other, because the SEM image is a secondary electron image created from secondary electrons emitted from the surface of the specimen, while the TEM/STEM images are transmission images created from electrons transmitted through the specimen.

Figure 7:
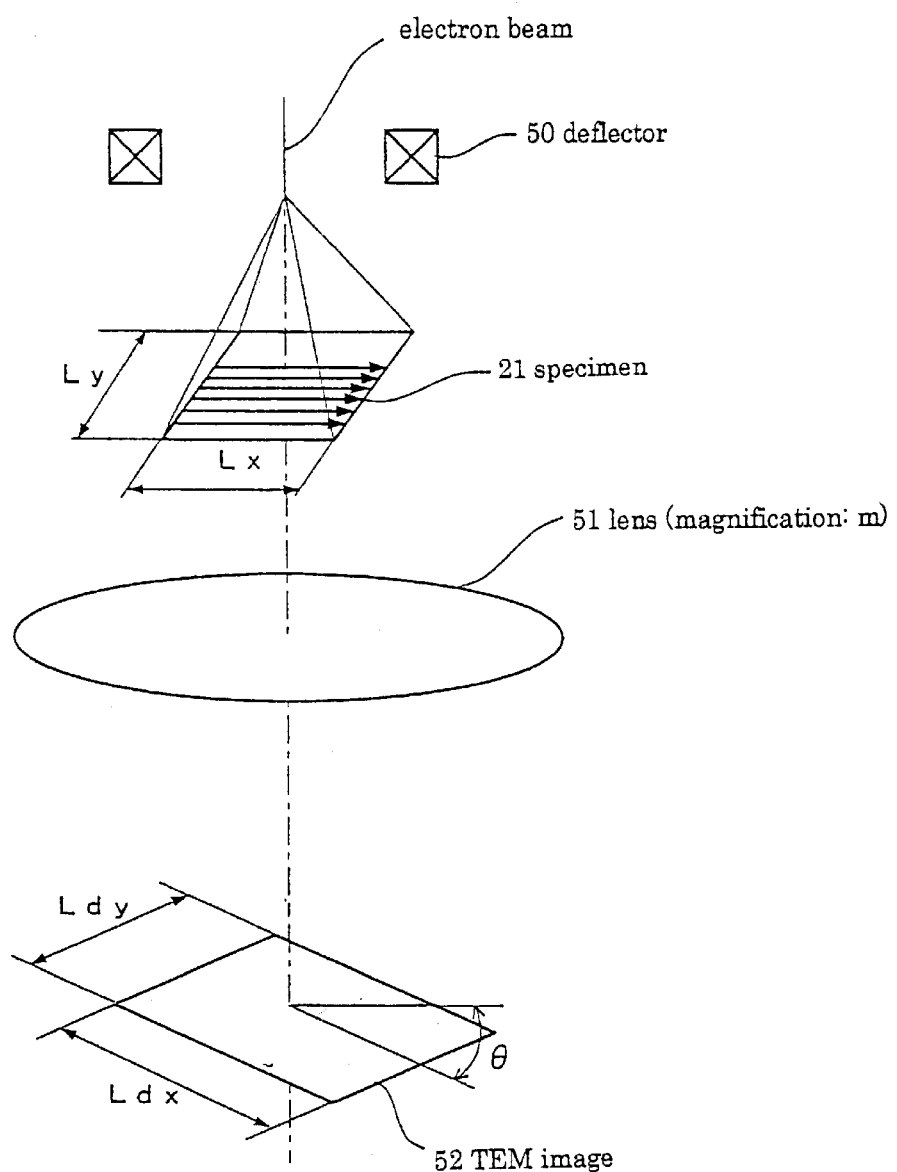
FIG. 7 is a diagram illustrating the positional relation between a specimen and a TEM image.
Figure 8:
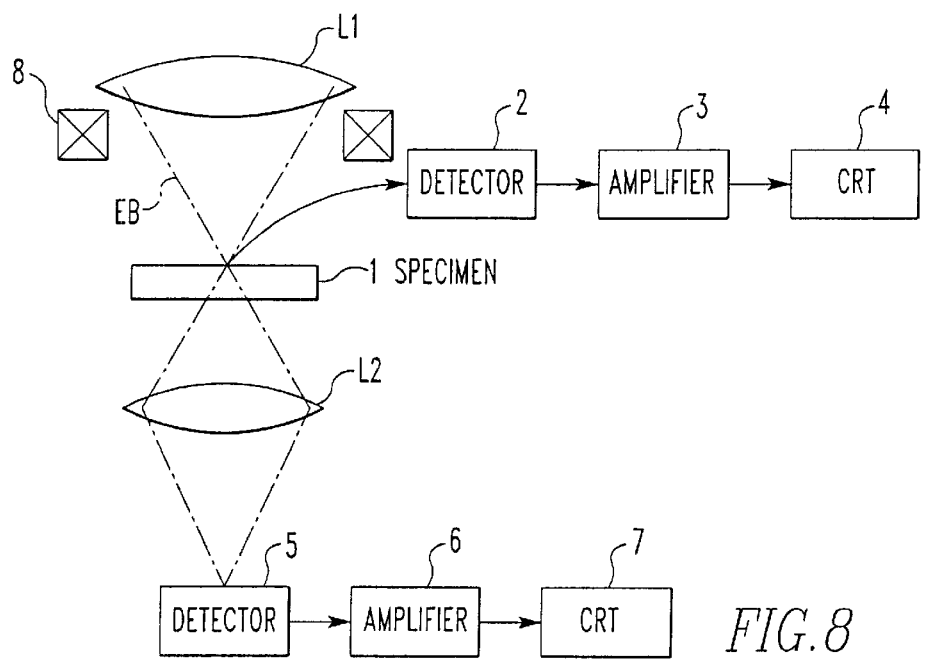
FIG. 8 is a conceptual block diagram of the combined electron microscope in the SEM/STEM mode.
Figure 9:
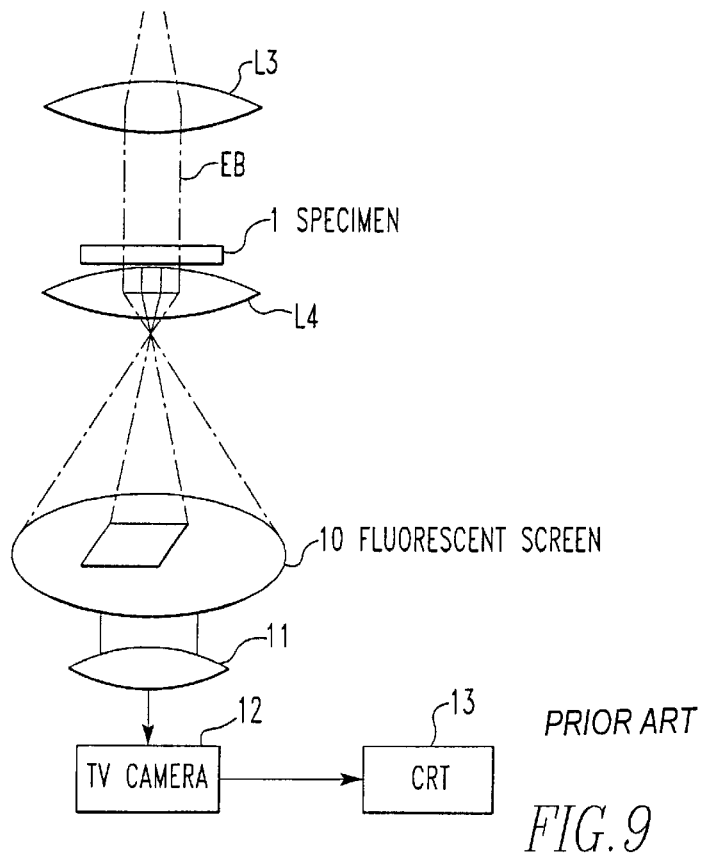
FIG. 9 is a diagram similar to FIG. 8 but in the TEM mode.

FIG. 7 shows the relation between the specimen and the TEM image 52. Note that like components are denoted by like reference numerals in both FIGS. 1 and 7. A deflector 50 deflects the electron beam in the X- and Y-directions in the SEM/STEM mode. An electron lens 51 magnifies the electron beam transmitted through a specimen 21 by a factor of m. A TEM image 52 is focused onto a TV fluorescent screen. The deflector 50 corresponds to the scan coils CLA1 and CLA2 of FIG. 1. The electron lens 51 corresponds to the imaging lenses IL1, IL2, IL3, and PL of FIG. 1. The electron beam transmitted through the specimen 21 is magnified by the electron lens 51 by a factor of m and focused onto the TV fluorescent screen. As a result, a TEM image as shown is obtained. Let Lx be the length of the specimen 21 taken in the X-direction. Let Ly be the length of the specimen 21 taken in the y-direction.

$$Lx = \frac{Ldx \cdot \cos\theta + Ldy \cdot \sin\theta + ddx}{m}$$

$$Ly = \frac{Ldy \cdot \cos\theta - Ldx \cdot \sin\theta + ddy}{m}$$

where θ is the angle of rotation of the TEM image focused on the TV fluorescent screen by the electron lens 51 from the specimen 21, Ldx is the length taken in the X-direction, Ldy is the length taken in the Y-direction, m is the magnification, ddx is the offset of the field of view in the X-direction, and ddy is the offset of the field of view in the Y-direction.

In the above embodiment, the SEM/STEM images and TEM image are displayed on the same display portion 35 of the computer 40. The images may also be displayed on plural display portions. Furthermore, they may be displayed on a display portion dedicated for SEM/STEM images and on a display portion dedicated for TEM images, respectively, rather than on the display portion 35 of the computer 40. In addition, the mode of operation may be switched between a mode in which the magnifications and angles of rotation are brought into coincidence and a mode in which they are not brought into coincidence as in the conventional technique. In this case, the switching operation may be commanded through the operation portion 36 ancillary to the computer 40.

In the above description, the imaging system is made up of four stages of lenses, i.e., IL1, IL2, IL3, and PL. The object of the present invention is normally achieved if there are three or more stages of lenses. The objective lens OL and objective minilens OM also rotate the TEM image. Even in the above description where this image rotation is not taken into consideration, the purpose of the invention is attained. Additionally, in the above description, it is assumed that the magnification of the SEM/STEM images is the same as the magnification of the TEM image. It would be easily understood from the above description that only the angle of rotation can be corrected, even if the SEM/STEM images and TEM image are different in magnification.

According to the present invention, the angle of rotation of SEM/STEM images can be aligned to a TEM image that rotates according to the magnification. The orientation of the TEM image can be aligned to the SEM/STEM images that are rotated arbitrarily and displayed. Furthermore, the angle of rotation (orientation) of the SEM/STEM images can be aligned to the TEM image that rotates according to the magnification.

As described in detail thus far, the invention makes it possible to match the angle of rotation of the SEM/STEM images to a TEM image that rotates according to the magnification. The orientation of the TEM image can be aligned to the SEM/STEM images that are rotated arbitrarily and displayed. In this way, the SEM/STEM images and the TEM image are displayed while their magnifications and angles of rotations are brought into coincidence. This can improve the correspondence between the fields of view. Furthermore, since the image information obtained in each mode is stored in memory, the user can make good comparisons of the images on the display portion by observation. Additionally, the user can intuitively check the fields of view without searching for a desired field of view, because the two kinds of images are identical in magnification and angle of rotation.

Having thus described my invention with the detail and particularity required by the Patent Laws, what is desired protected by Letters Patent is set forth in the following claims.

What is claimed is:

1. A combined electron microscope having an SEM/STEM mode and a TEM mode and being capable of producing observable SEM/STEM images and TEM images, said combined electron microscope comprising:

a scanning device for the SEM/STEM mode;

a memory in which magnifications of TEM images and angles of rotation of the images at those magnifications are stored;

a computer control system for making corrections based on data stored in said memory to match SEM/STEM images in the SEM/STEM mode to the angle of rotation of a TEM image by controlling said scanning device; and a display device for displaying the images corrected by said computer control system.

2. The combined electron microscope of claim 1, wherein said corrections are made by causing said computer control system to perform given calculations based on angles of rotation stored in said memory and controlling said scanning device according to the results of the calculations.

3. The combined electron microscope of claim 1, wherein results of calculations previously performed to make corrections to the SEM/STEM images based on the angles of rotation of the TEM images are stored in said memory, and wherein said scanning device is controlled according to said results stored in said memory.

4. A combined electron microscope having an SEM/STEM mode and TEM mode and being capable of producing observable SEM/STEM images and TEM images, said combined electron microscope comprising:

a scanning device for the SEM/STEM mode;

plural imaging lenses for the TEM mode;

a first memory in which magnifications of TEM images and current values to be supplied into said imaging lenses for the TEM mode relative to angles of rotation of the SEM/STEM images are stored to match the angle of rotation of each TEM image to the angle of rotation of corresponding SEM/STEM images;

a second memory in which angles of rotation of images relative to magnifications of TEM images are stored to match the angle of rotation of SEM/STEM images to the angle of rotation of a corresponding TEM image;

a computer control system for correcting the angle of rotation of said SEM/STEM images or said TEM images according to a used imaging mode based on data stored in one of said first and second memories by controlling said scanning device or said imaging lenses; and a display device for displaying the image corrected by said computer control system.

5. The combined electron microscope of claim 4, wherein said correction is made by causing said computer control system to control said imaging lenses based on first data stored in said first memory, said first data including the magnifications of TEM images relative to angles of rotation and current values supplied into said imaging lenses for the TEM mode, or causing said computer control system to perform given calculations based on angles of rotation stored in said second memory and to control said scanning device according to obtained results.

6. The combined electron microscope of claim 4, wherein results of calculations previously performed to make corrections to the SEM/STEM images based on the angles of rotation of said TEM images are stored in said second memory, and wherein said scanning device is controlled according to said results stored in said second memory.

* * * * *